US011300639B2

(12) United States Patent
Solmeyer et al.

(10) Patent No.: US 11,300,639 B2
(45) Date of Patent: Apr. 12, 2022

(54) INTEGRATED PHOTONICS TENSOR MAGNETOMETER

(71) Applicant: Honeywell International Inc., Charlotte, NC (US)

(72) Inventors: Neal Eldrich Solmeyer, Edina, MN (US); Steven Tin, Edina, MN (US); Matthew Wade Puckett, Phoenix, AZ (US); Robert Compton, Loretto, MN (US)

(73) Assignee: Honeywell International Inc., Charlotte, NC (US)

( * ) Notice: Subject to any disclaimer, the term of this patent is extended or adjusted under 35 U.S.C. 154(b) by 0 days.

(21) Appl. No.: 17/027,450

(22) Filed: Sep. 21, 2020

(65) Prior Publication Data
US 2021/0255260 A1 Aug. 19, 2021

Related U.S. Application Data

(60) Provisional application No. 62/976,208, filed on Feb. 13, 2020.

(51) Int. Cl.
*G01R 33/26* (2006.01)
(52) U.S. Cl.
CPC .................................. *G01R 33/26* (2013.01)
(58) Field of Classification Search
CPC .............................. G01R 33/26; G01R 33/022
See application file for complete search history.

(56) References Cited

U.S. PATENT DOCUMENTS

| 9,726,733 | B2 | 8/2017 | Smith et al. |
| 9,910,105 | B2 | 3/2018 | Boesch |
| 10,371,765 | B2 | 8/2019 | Kaup et al. |
| 2013/0265042 | A1 | 10/2013 | Kawabata et al. |
| 2020/0018802 | A1 | 1/2020 | Palacios Laloy et al. |

OTHER PUBLICATIONS

Puckett Matthew W. et al., "Integrated Photonics Quantum Vector Magnetometer", U.S. Appl. No. 16/788,819, filed Feb. 12, 2020, pp. 1 through 29, Published: US.
Puckett Matthew W. et al., "Quantum Vector Magnetometer Based on Nanoscale FIN Waveguide", U.S. Appl. No. 16/786,495, filed Feb. 10, 2020, pp. 1 through 35, Published: US.

*Primary Examiner* — Jay Patidar
(74) *Attorney, Agent, or Firm* — Fogg & Powers LLC (57) ABSTRACT

Systems and embodiments for an integrated photonics tensor magnetometer are described herein. In certain embodiments, a system includes a plurality of magnetometers. The system also includes a laser carrier wafer coupled to each of the plurality of magnetometers that commonly distributes one or more lasers to each of the magnetometers in the plurality of magnetometers. Additionally, the system includes a plurality of photodetectors that detect light emitted from the laser carrier wafer and the plurality of magnetometers. Further, the system includes one or more processors that execute computer-executable instructions that cause the processor to monitor and control operation of the one or more lasers and calculate a magnetic field gradient based on the detected light from the magnetometers.

20 Claims, 4 Drawing Sheets

INTEGRATED PHOTONICS TENSOR MAGNETOMETER

CROSS-REFERENCE TO RELATED APPLICATION

This application claims the benefit of U.S. Provisional Application Ser. No. 62/976,208, filed Feb. 13, 2020, and titled "INTEGRATED PHOTONICS TENSOR MAGNETOMETER," which is hereby incorporated herein by reference.

BACKGROUND

Many applications use sensing devices to measure magnetic field tensors, which include the measurements of vector fields and the associated field gradients. Measuring magnetic field gradients may allow for the rejection of many sources of error and/or noise that potentially exists when acquiring only magnetic magnitude or magnetic vector field measurements. Additionally, the measuring of magnetic field gradients may allow for a larger variety of magnetic field distributions to be determined. Typically, magnetic gradiometers may use three or more measurements provided by vector magnetometers to calculate a magnetic gradient, where each magnetic vector measurement may be produced using three scalar magnetometers, each sensitive along an orthogonal axis. Accordingly, a magnetic field gradient may be produced using nine or more scalar measurements.

SUMMARY

Systems and embodiments for an integrated photonics tensor magnetometer are described herein. In certain embodiments, a system includes a plurality of magnetometers. The system also includes a laser carrier wafer coupled to each of the plurality of magnetometers that commonly distributes one or more lasers to each of the magnetometers in the plurality of magnetometers. Additionally, the system includes a plurality of photodetectors that detect light emitted from the laser carrier wafer and the plurality of magnetometers. Further, the system includes one or more processors that execute computer-executable instructions that cause the processors to monitor and control operation of the one or more lasers and calculate a magnetic field gradient based on the detected light from the magnetometers.

DRAWINGS

Understanding that the drawings depict only some embodiments and are not, therefore, to be considered limiting in scope, the exemplary embodiments will be described with additional specificity and detail using the accompanying drawings, in which.

Per common practice, the various described features are not drawn to scale but are drawn to emphasize specific features relevant to the example embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made.

Systems and methods for an integrated photonics tensor magnetometer are described herein. A device may measure a magnetic field tensor (i.e., the magnetic field gradient) by comparing the vector components of magnetometers located at three or more different spatial locations. In some implementations, magnetometers may be located at three separate locations but coupled to different ports of a common laser carrier wafer. The laser carrier wafer may include waveguides or other optical structures that commonly distribute one or more lasers to output ports through which an associated magnetometer receives the one or more lasers. A laser is commonly distributed when the laser received by the magnetometers are produced from the same laser source and experience similar changes other than changes related to the unique connections between the laser carrier wafer and the magnetometers. The laser carrier wafer may further include various pickoff waveguides and/or additional ports for conveying the laser light to various photodetectors for monitoring the noise, frequency, power, among other characteristics of the laser light propagating within waveguides or provided by the laser carrier wafer.

In some embodiments, the magnetometers may use combinations of integrated photonic components such as waveguides, fiver, and free-space optics. Also, the magnetometers may include combinations of preparation or readout supplied by either electrical or optical components. One or more processors may use signals of detected lasers to monitor the operation of the lasers, control the lasers, and correct intensity fluctuations and other errors that may arise during the operation of the lasers. Also, the processor may compute magnetic vector fields for the three or more magnetometers. Then, the processor may use the differences in the magnetic vector fields to calculate a magnetic field gradients or magnetic tensor.

Figure 1:
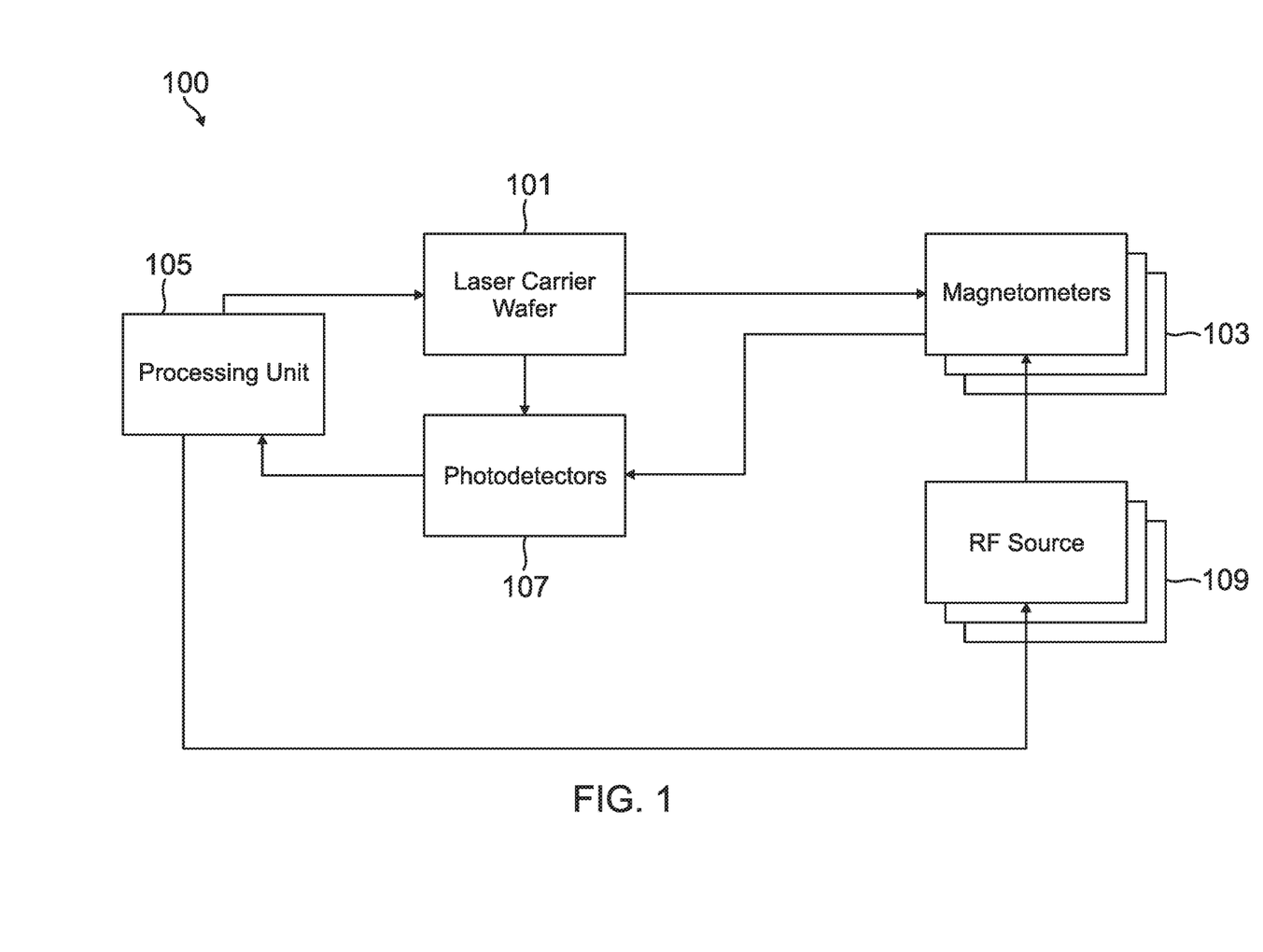
FIG. 1 is a block diagram illustrating an exemplary system for an integrated photonics tensor magnetometer according to an aspect of the present disclosure.

FIG. 1 is a block diagram of a system 100 for acquiring magnetic field gradient measurements using an integrated photonics tensor magnetometer. As illustrated, the system 100 may acquire magnetic field gradient measurements using multiple magnetometers 103. As described herein, the magnetometers 103 may refer to a sensor that can acquire information regarding magnetic field strength. The magnetometers 103 may be multiple scalar magnetometers that provide different measurements that are combined to form a vector measurement of a magnetic field, or the magnetometers 103 may be vector magnetometers that provide vector measurements of magnetic fields. Additionally, the magnetometers may provide magnetic field measurements using received optical light. Some magnetometers 103, such as NV-diamond based magnetometers, may detect the vector components of a magnetic field within a single measurement region. The ability to detect vector components within a single region may permit smaller magnetometers 103 with the desired functionality for many applications. Also, magnetometers 103 with optical access, either for preparation or readout of the measurement, can further reduce weight and size when using integrated photonics elements.

In certain embodiments of magnetometers 103 with optical access, the magnetometers 103 may refer to a sensor that uses changes in laser light to detect magnetic field strength and direction. For example, the magnetometers 103 may be fabricated using materials that absorb light at particular frequencies, where the frequency of light absorption is dependent on the magnetic field experienced by the material. For example, nitrogen-vacancy diamond (NV diamond), silicon carbide with defect centers, or other material may have the above sensitivities when experiencing magnetic fields. Examples of potential magnetometers using these materials are described in the U.S. Non-Provisional application Ser. No. 16/786,495, filed Feb. 10, 2020, entitled "QUANTUM VECTOR MAGNETOMETER BASED ON NANOSCALE FIN WAVEGUIDE" (hereinafter "the '495 application"), which claims the benefit of U.S. Provisional Application Ser. No. 62/928,157, filed Oct. 30, 2019, and titled "QUANTUM VECTOR MAGNETOMETER BASED ON NANOSCALE FIN WAVEGUIDE" (hereinafter "the '157 application"), where both applications are hereby incorporated herein by reference. Additionally, examples of potential magnetometers using these materials are described in the U.S. Non-Provisional application Ser. No. 16/788,819, filed Feb. 12, 2020, entitled "INTEGRATED PHOTONICS QUANTUM VECTOR MAGNETOMETER" (hereinafter "the '819 application"), which claims the benefit of U.S. Provisional Application Ser. No. 62/912,533, filed Oct. 8, 2019, entitled "INTEGRATED PHOTONICS QUANTUM VECTOR MAGNETOMETER" (hereinafter "the '533 application"), where both applications are hereby incorporated herein by reference.

In certain embodiments, the material used to fabricate the magnetometers 103 may be sensitive to radio frequencies (RF) as described in the '495 and '819 applications. Accordingly, the system 100 may include multiple separate RF sources 109, where each of the multiple RF sources 109 is associated with an individual magnetometer 103. In particular, each of the RF sources 109 may expose the associated magnetometer 103 to a range of radio frequencies. The resonant frequency being a frequency at which the material of the magnetometer 103 absorbs light of a particular wavelength. Further, the resonant frequency varies based on the strength of the magnetic field experienced by the magnetometers 103. Thus, the range of frequencies of the RF energy provided by the RF sources 109 to the associated magnetometers 103 may include resonant frequencies caused by the expected range of magnetic field strengths for the environment of the magnetometers 103.

In some embodiments, each of the magnetometers 103 may be spatially located apart from one another. As the magnetometers 103 can acquire measurements at their respective locations, by being at different locations, the measurements of the separate magnetometers 103 may be used to calculate a magnetic gradient for the area spanned by the locations of the multiple magnetometers 103. In some embodiments, the magnetometers 103 may be located relatively close to one another. Alternatively, the magnetometers 103 may be located at a farther distance from one another. When the magnetometers 103 are located close to one another, the sensitivity of the resultant magnetic gradient measurement may be limited. Also, the effects of noise on the measurement of the magnetic gradient measurement increases in proportion to the distance between the magnetometers 103. Accordingly, the different magnetometers may be placed at particular distances apart from one another to balance the sensitivity of the magnetic gradient with the effects of noise on the measurements of the different magnetometers 103.

In some embodiments, the system 100 may include one or more photodetectors 107 and one or more processors 105. In some embodiments, the photodetectors 107 may detect the light produced from the magnetometers 103. For example, as discussed in the '495 and '819 patent applications, the magnetometers 103 may provide a pump laser and a probe laser as an output, where the intensity of the pump laser and the probe laser may be detected by associated photodetectors 107. The photodetectors 107 may convert the detected pump laser and the probe laser into electrical signals for subsequent processing by one or more processors 105.

As used herein, a processor 105 may be any computational device or circuitry that can execute computer-readable instructions that cause the processor 105 to monitor the intensity of the probe laser as detected by some of the photodetectors 107. Also, the instructions may cause the processor 105 to control the frequencies of the RF energy emitted by the RF sources 109. By detecting the intensity of the probe laser and controlling the frequencies of the RF energy, the processor 105 may determine the frequencies of the RF energy associated with the absorption of the probe laser. Using the information regarding the frequencies of the RF energy, the processor 105 may calculate the magnetic field vectors measured by the different magnetometers 103. Additionally, using the calculated magnetic field vectors for the magnetometers 103 and information regarding the physical location of the magnetometers 103 relative to each other, the processor 105 may also calculate the magnetic field gradients for the area between the locations of the magnetometers 103.

The processor 105 may be implemented using software, firmware, hardware, or other appropriate combinations thereof. The processor 105 and/or other computational devices may be supplemented by, or incorporated in, especially-designed application-specific integrated circuits (ASICs) or field programmable gate arrays (FPGAs). The processor 105 and other computing devices may also include or function with software programs, firmware, or other computer-readable instructions for carrying out various process tasks, calculations, and control functions used in the present methods and systems.

Further, the methods described herein may be implemented by computer-executable instructions such as program modules or components, which are executed by at least one processor, such as the processor 105. Generally, program modules include routines, programs, objects, data components, data structures, algorithms, and the like, which perform particular tasks or implement particular abstract data types. Instructions for carrying out various process tasks, calculations, and generation of other data used in the operations of the methods described herein may be implemented in software, firmware, or other computer-readable instructions. These instructions are typically stored on any appropriate computer program product that includes a computer-readable medium used for storage of computer-readable instructions or data structures. The computer-readable medium may be any available media that can be accessed by a general-purpose or special-purpose computer or processor, or any programmable logic device. In certain implementations, the computer-readable medium may be part of a memory in communication with the processor 105.

Suitable computer-readable storage media, such as that found as part of the memory in communication with the processor 105, may include, for example, non-volatile memory devices including semiconductor memory devices such as random access memory (RAM), read-only memory (ROM), electrically erasable programmable ROM (EEPROM), or flash memory devices; magnetic disks such as internal hard disks or removable disks; optical storage devices such as compact discs (CDs), digital versatile discs (DVDs), Blu-ray discs; or any other media that can be used to carry or store desired program code in the form of computer-executable instructions or data structures.

As described above, the magnetometers 103 may be spatially located at different locations to provide magnetic field measurements to the processor 105 such that magnetic field gradients for the area spanned by the magnetometers 103 may be measured. As the magnetometers 103 are located at different locations, the performance of the system 100 in calculating magnetic field gradients may be significantly degraded when the magnetometers 103 are subjected to sources of noise that are not common to the magnetometers 103 in the system 100. One potential source of noise may be independent light sources associated with the different magnetometers 103. Accordingly, the system 100 may include a laser carrier wafer 101. As described herein, a laser carrier wafer 101 may be a device that commonly distributes laser beams from one or more laser sources to each of the magnetometers 103 in the system 100. For example, each of the magnetometers 103 may use light from a pump laser and a probe laser to detect magnetic fields as described in the '495 and '819 applications. Accordingly, the system 100 may include a single pump laser source and a single probe laser source, and the laser carrier wafer 101 may distribute the light from the single pump laser and the single probe laser to each of the magnetometers 103 in the system 100. In some embodiments, the single pump laser may be a pump laser integrated cavity and the probe laser may be a probe laser integrated cavity, where the integrated cavities are formed on the laser carrier wafer 101 and are capable of generating lasers at a controlled frequency. Thus, sources of noise that affect the lasers provided by the laser carrier wafer 101 may be substantially common before the lasers are provided to the magnetometers 103 because the lasers are commonly distributed to the connected magnetometers.

In additional embodiments, the laser carrier wafer 101 may provide a portion of the lasers to the photodetectors 107. For example, the laser carrier wafer 101 may provide portions of both the pump laser and the probe laser to the photodetectors 107. The photodetectors 107 may convert the detected light into electrical signals and provide the electrical signals to the processor 105. The processor 105 may use the electrical signals that represent the detected light to monitor and control the operation of the pump laser source and the probe laser source.

In certain embodiments, the processor 105 or other circuitry may monitor the provided electrical signals to identify noise that is unique to the different magnetometers 103 based on differences between the lasers detected from the laser carrier wafer 101 and lasers detected from the different magnetometers 103. Further, the processor 105 may also monitor the intensity and frequency of the lasers detected from the laser carrier wafer 101 and the magnetometers 103. Also, for some magnetometers, such as NV diamond based magnetometers, the processor 105 may monitor the intensity of the light to identify the radio frequencies emitted by the RF sources 109 that cause the probe laser to be absorbed within the magnetometer 103. Based on the identified radio frequencies, the processor 105 may calculate vector measurements of the magnetic fields at the locations of the different magnetometers 103, and then use the calculated vector measurements to calculate a measurement of the magnetic field gradient for the area spanned by the magnetometers.

In exemplary embodiments, the processor 105 may send control signals based on the monitored intensity and frequency of the lasers to control the operation of the lasers provided by the laser carrier wafer. For example, the processor 105 may detect if the frequency of the laser sources is drifting away from the desired frequency or if the intensity of the laser sources is declining. In response, the processor 105 may change the frequency of the laser source to maintain the laser to the desired frequency. Also, control signals from the processor 105 may increase or decrease the frequency of the laser based on the detected intensity of the lasers. Further, the processor 105 may remove the effects of identified noise from the measurements from the magnetometers 103. Thus, the laser carrier wafer 101, in conjunction with the photodetectors 107 and the processor 105, may be able to reduce the noise and other sources of errors in the lasers provided to the magnetometers 103 in addition to making error sources common for the magnetometers 103.

Figure 2:
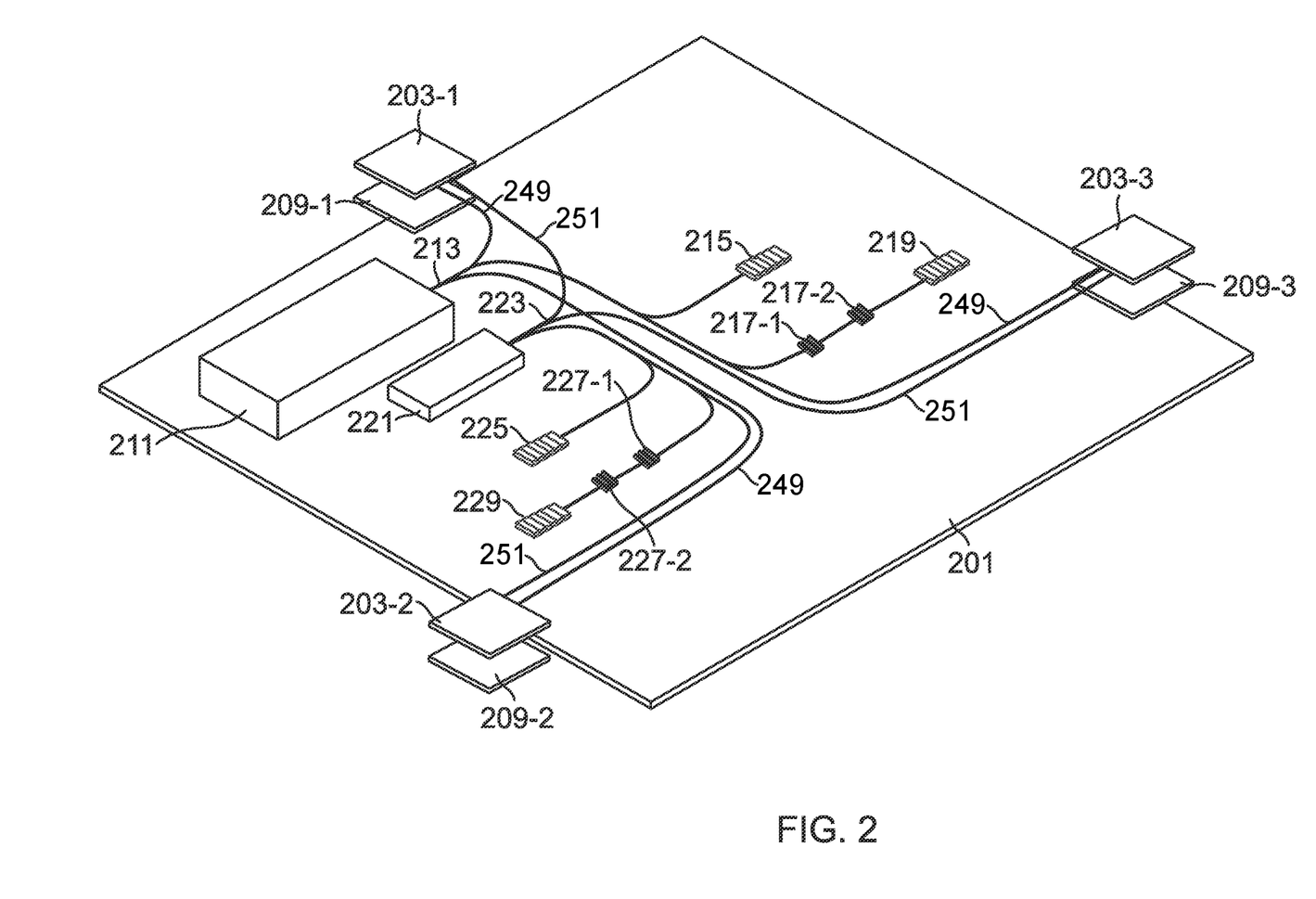
FIG. 2 is an isometric diagram of a laser circuit wafer within an integrated photonics tensor magnetometer according to an aspect of the present disclosure.

FIG. 2 is a detailed diagram of an exemplary embodiment of a laser carrier wafer 201. The laser carrier wafer 201 may function substantially similar to the laser carrier wafer 101 described above in connection with FIG. 1. In particular, the laser carrier wafer 201 may distribute laser light provided from laser sources to magnetometers 203-1, 203-2, and 203-3. For example, the laser carrier wafer 201 may include a pump laser source 211 and a probe laser source 221 that may be integrated cavities mounted on the laser carrier wafer 201. Alternatively, one or both of the pump laser source 211 and the probe laser source 221 may provide light that is coupled into the laser carrier wafer 201 for distribution to the magnetometers in connection with the laser carrier wafer 201.

As described in the '495 and '819 applications, the pump laser source 211 may provide a laser having a particular wavelength that optically excites point defects in the material used to manufacture the magnetometers 203-1, 203-2, and 203-3. When the point defects are optically excited, the laser may cause the point defects to experience spin conserving transitions from a ground triplet state to an excited triplet state. For example, when the material used to make the magnetometers 203-1, 203-2, and 203-3 is NV diamond, a laser having a wavelength of 532 nm may cause the point defects to experience spin conserving transitions from the ground triplet state to the excited triplet state.

Further, RF sources 209-1, 209-2, and 209-3, that function similarly to the RF sources 109 described in connection with FIG. 1, may expose associated magnetometers 203-1, 203-2, and 203-3 to RF signals at a range of frequencies that includes a resonant frequency for the material of the magnetometers 203-1, 203-2, and 203-3. At the resonant frequency, point defects in the material of the magnetometer 203-1, 203-2, and 203-3 at an excited state may relax through an intersystem crossing to a shelved state. At a shelved state, the point defects can absorb light having a particular wavelength. Thus, the laser carrier wafer 201 may also include a probe laser source 221 that provides a laser light at the particular wavelength. The particular wavelength of the probe laser source 221 may be 1042 nm when the material is NV diamond. The ability of the point defects to absorb the probe laser is dependent on the RF source 209-1, 209-2, and 209-3 exposing the material to signals at the resonant frequency; the resonant frequency is dependent on the magnetic field experienced by the magnetometer 203-1, 203-2, and 203-3; and the sensitivity of the point defect to the magnetic field is dependent on the orientation of the point defect to the magnetic field. In NV diamond, for example, there are four potential defect orientations. The three cartesian components of a vector field can be reconstructed from the measurements of the magnetic field projections along the four defect orientations. Thus, a processor 105 may determine a magnetic field vector by measuring the intensity of the probe laser over a range of RF frequencies that includes the resonant frequency of the different point defects.

In certain embodiments, the laser carrier wafer 201 may route the pump laser provided by the pump laser source 211 and the probe laser provided by the probe laser source 221 to three or more magnetometers 203-1, 203-2, and 203-3. In some implementations, the laser carrier wafer 201 may use similar mechanisms to control the path of the pump laser and the probe laser through the laser carrier wafer 201. As shown, the laser carrier wafer 201 routes the pump laser and the probe laser to the magnetometers 203-1, 203-2, and 203-3, which are shown as abutting against the laser carrier wafer 201. However, the magnetometers 203-1, 203-2, and 203-3 may acquire light from the laser carrier wafer 201 using other means such as fiber optic cables, free space transmission, and the like. However, different connections may introduce noise into the laser, thus negatively affecting the operation of the tensor magnetometer.

In some embodiments, to control the path of the pump laser through the laser carrier wafer 201, the laser carrier wafer 201 may include an optical splitter 213 that splits the pump laser along multiple pump laser waveguide paths 249, where each pump laser waveguide path 249 is associated with and routed through different waveguides on the laser carrier wafer 201 to an output port of the laser carrier wafer 201 for connection to one of the magnetometers 203-1, 203-2, and 203-3. Similarly, to control the path of the probe laser through the laser carrier wafer 201, the laser carrier wafer 201 may include an optical splitter 223 that splits the probe laser along multiple probe laser waveguide paths 251, where each probe laser waveguide path 251 is associated with and routed through different waveguides on the laser carrier wafer 201 to an output port of the laser carrier wafer 201 for connection to one of the magnetometers 203-1, 203-2, and 203-3.

In additional embodiments, the laser carrier wafer 201 may include multiple features that route the probe laser and the pump laser towards off-chip photodetectors (such as the photodetectors 107 in FIG. 1). For example, the laser carrier wafer 201 may have multiple splitters that split off the pump laser from one or more of the waveguides connected to an output port of the laser carrier wafer 201. In particular, a splitter may couple light towards a vertical grating 215. When the pump laser is coupled into the vertical grating 215, the pump laser may be coupled away from the plane of the laser carrier wafer 201 towards a photodetector above the laser carrier wafer 201. Alternatively, instead of using the vertical grating 215, the pump laser may be routed to an additional output port that is connected to another photodetector, or an on-chip photodetector.

In some embodiments, when light from the vertical grating 215 is incident on a photodetector, the photodetector may convert the light into an electrical signal and provide the electrical signal to a processor, such as the processor 105 in FIG. 1. The processor 105 may then monitor the electrical signal for intensity noise in the pump laser. Also, the processor 105 may adjust the performance of the electrical signal for noise in the pump laser. Further, the noise in the pump laser may be coupled back into the pump laser in a negative feedback loop to remove the noise.

Additionally, the laser carrier wafer 201 may couple light towards a frequency monitor cavity and cavity grating 219. The pump laser may be coupled into a resonant cavity before being incident on the cavity grating 219. As shown the resonant cavity may include two mirrors 217 (a first mirror 217-1 and a second mirror 217-2) that are separated from one another by a specific distance that is associated with a particular wavelength. The mirrors 217 may be Bragg reflecting gratings in the waveguide or some other type of mirror. Accordingly, when light is coupled into the cavity, the light at the resonant frequency may pass through to the cavity grating 219. The cavity grating 219 may then couple the light away from the plane of the laser carrier wafer 201 towards a photodetector above the laser carrier wafer 201. Alternatively, the resonant light may be routed to an additional output port that is connected to another photodetector.

Further, when the light from the cavity grating 219 is incident on a photodetector, the photodetector may convert the light into an electrical signal that is indicative of the intensity coupled out of the laser carrier wafer 201 by the cavity grating 219, where the electrical signal is provided to a processor, such as the processor 105 in FIG. 1. The processor 105 may then monitor the electrical signal to determine if the pump laser is at the correct wavelength. If the processor 105 determines that the pump laser is not at the right wavelength based on the intensity of the light received from the cavity grating 219, the processor 105 may adjust the wavelength of the pump laser so that the pump laser resonates between the first mirror 217-1 and the second mirror 217-2 and is locked to a resonant frequency.

Similarly, the laser carrier wafer 201 may have multiple splitters that split off the probe laser from one or more of the waveguides connected to an output port of the laser carrier wafer 201. In particular, a splitter may couple light towards a vertical grating 225. When the probe laser is coupled into the vertical grating 225, the probe laser may be coupled away from the plane of the laser carrier wafer 201 towards a photodetector above the laser carrier wafer 201. Alternatively, instead of using the vertical grating 225, the probe laser may be routed to an additional output port that is connected to another photodetector.

In some embodiments, when light from the vertical grating 225 is incident on a photodetector, the photodetector may convert the light into an electrical signal, and provide the electrical signal to a processor, such as the processor 105 in FIG. 1. The processor 105 may then monitor the electrical signal for noise in the probe laser. Also, the processor 105 may adjust the performance of the electrical signal for noise in the probe laser. Further, the noise in the probe laser may be coupled back into the probe laser in a negative feedback loop to remove the noise.

Additionally, the laser carrier wafer 201 may couple light towards a frequency monitor cavity and cavity grating 229. The probe laser may be coupled into a resonant cavity before being incident on the cavity grating 229. As shown the resonant cavity may include two mirrors (a first mirror 227-1 and a second mirror 227-2) that are separated from one another by a specific distance that is associated with a particular wavelength. The mirrors 217 may be Bragg reflecting gratings in the waveguide or some other type of mirror. Accordingly, when light is coupled into the cavity, the light at the resonant frequency may pass through to the cavity grating 229. The cavity grating 229 may then couple the light away from the plane of the laser carrier wafer 201 towards a photodetector above the laser carrier wafer 201.

Alternatively, the resonant light may be routed to an additional output port that is connected to another photodetector.

Further, when the light from the cavity grating 229 is incident on a photodetector, the photodetector may convert the light into an electrical signal that is indicative of the intensity coupled out of the laser carrier wafer 201 by the cavity grating 229, where the electrical signal is provided to a processor, such as the processor 105 in FIG. 1. The processor 105 may then monitor the electrical signal to determine if the probe laser is at the correct wavelength. If the processor 105 determines that the probe laser is not at the right wavelength based on the intensity of the light received from the cavity grating 229, the processor 105 may adjust the wavelength of the probe laser so that the probe laser resonates between the first mirror 227-1 and the second mirror 227-2 and is locked to the resonant frequency.

As described above, the laser carrier wafer 201 may provide multiple lasers, such as the pump laser provided from the pump laser source 211 and the probe laser provided from the probe laser source 221, to any connected magnetometers, such as magnetometers 203-1, 203-2, and 203-3. Additionally, the laser carrier wafer 201 may include mechanisms for monitoring the noise on and the wavelength of the pump laser and the probe laser. Accordingly, the laser carrier wafer 201 may provide lasers to the output ports that have both common and reduced noise.

Figure 3:
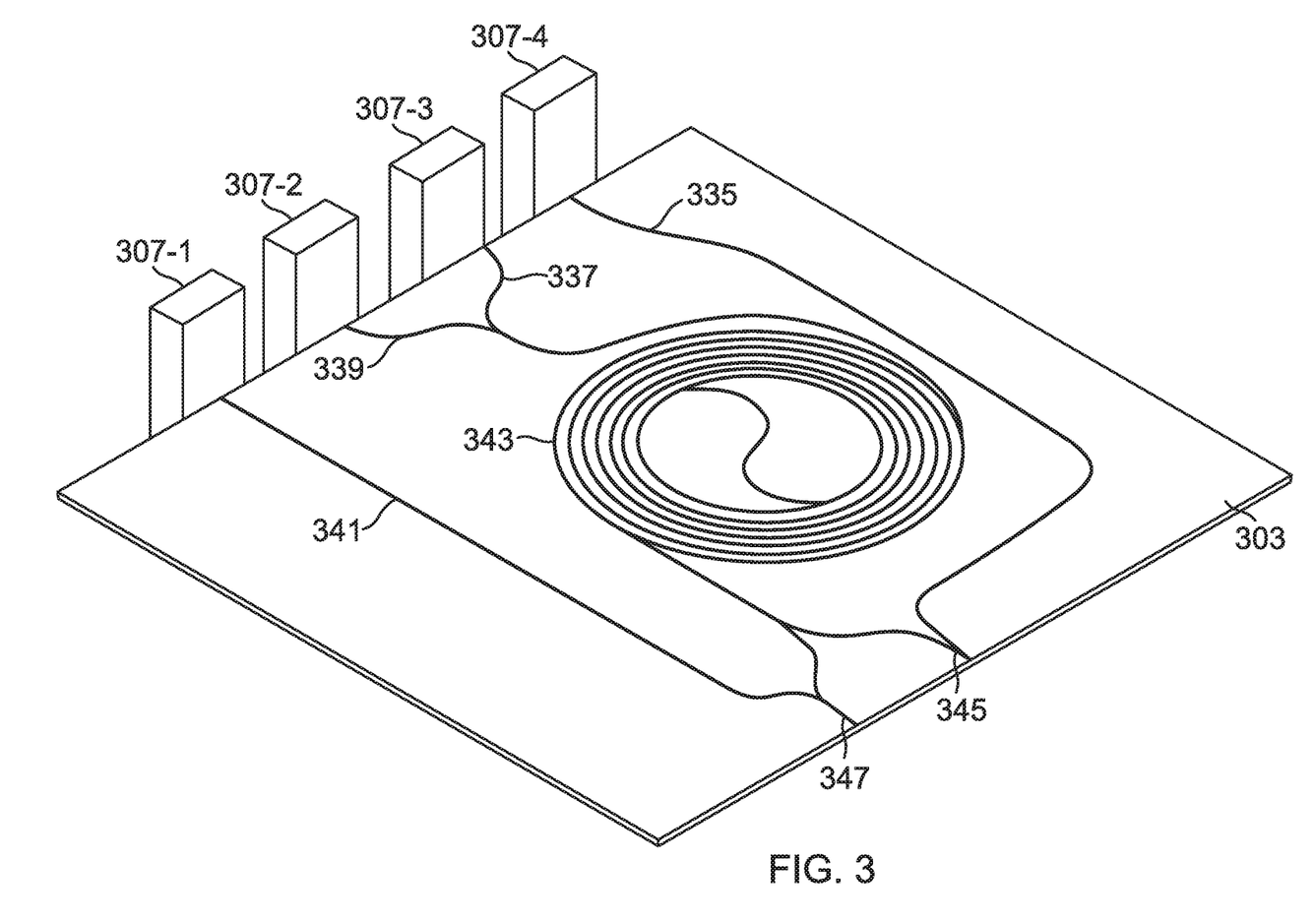
FIG. 3 is an isometric diagram of a vector magnetometer within an integrated photonics tensor magnetometer according to an aspect of the present disclosure.

FIG. 3 is a diagram of an exemplary vector magnetometer 303 within an integrated photonics tensor magnetometer. The vector magnetometer 303 may function similarly to magnetometers described in the '495 and '819 applications. As illustrated, the vector magnetometer 303 may include multiple input ports for receiving light provided by the laser carrier wafer 201. For example, the vector magnetometer 303 may include a probe input port 347 and a pump laser input port 345. As described above, the vector magnetometer 303 may be abutted against an associated laser carrier wafer 201. Alternatively, the vector magnetometer 303 may be connected to an associated laser carrier wafer 201 using other optical connections such as optical fibers, multicore couplers, and the like. In embodiments, where the vector magnetometer 303 abuts against an associated laser carrier wafer 201, the probe input port 347 and the pump laser input port 345 may be directly connected to an associated probe output port and pump output port on the laser carrier wafer 201.

In some embodiments, the pump laser input port 345 and the probe input port 347 may each be split onto separate waveguide paths, where a first path connects the input port to an associated bare waveguide, and the second path connects the input port to an absorption region 343. In some embodiments, the pump and probe laser may have a significant overlap in the absorption region 343. As used herein, bare waveguides refer to waveguides having little to no overlap between the pump and probe lasers. For example, the second path connects the pump laser input port 345 and the probe input port 347 to an absorption region 343. As used herein, the absorption region 343 may refer to a region within the vector magnetometer 303 where a first waveguide having a portion of the pump laser propagating therein and a second waveguide having a portion of the probe laser propagating therein extend proximate to one another through a coupling length. Within the absorption region 343, the pump laser, introduced into the first waveguide from the pump laser input port 345, is coupled into the second waveguide as described within the '495 and '819 applications.

In the presence of a resonant frequency signal, such as a resonant frequency signal provided by an RF source 109, the pump laser may condition point defects within the second waveguide throughout the absorption region 343 to absorb the probe laser such that the power of the probe laser propagating within the second waveguide experiences a decrease in power as the probe laser propagates through the absorption region 343. To monitor the power of the probe laser after propagation through the absorption region 343, the vector magnetometer 303 may couple the waveguide having the probe laser propagating therein to a probe laser detection photodetector 307-2 through a probe laser detection waveguide 339. The probe laser detection photodetector 307-2 may provide an electrical signal representing the intensity of the probe laser to a processor, such as a processor 105 in FIG. 1. The processor 105 may calculate a magnetic field vector using the intensity of the probe laser and information describing the RF signals applied to the vector magnetometer 303 by the associated RF source 109. Also, the processor 105 may monitor the power of the pump laser after propagating through the absorption region 343 by receiving electrical signals from a photodetector 307-3, where the photodetector 307-3 may be coupled to the absorption region 343 through a pump laser detection waveguide 337.

Additionally, the vector magnetometer 303 may provide outputs to other photodetectors 307 for detecting other aspects of the operations of the vector magnetometer 303. For example, vector magnetometer 303 may connect to a pump laser detection photodetector 307-3 for detecting the intensity of the pump laser on the first waveguide, which is the waveguide connected to the pump laser input port 345. Additionally, the vector magnetometer 303 may connect photodetectors 307 to bare waveguides such as the bare pump waveguide 335 and the bare probe waveguide 341 (referred to herein collectively as bare waveguides). For example, the bare pump waveguide 335 connects the pump laser input port 345 to a bare pump photodetector 307-4. Similarly, the bare pump waveguide 335 connects the probe input port 347 to a bare probe photodetector 307-1. Both the bare pump photodetector 307-4 and the bare probe photodetector 307-1 may provide electrical signals to a processor, such as the processor 105 in FIG. 1. The processor 105 may use the electrical signals provided from detecting the light in the bare waveguides to normalize fluctuations in laser power that are different for different vector magnetometers 303 that are connected to the laser carrier wafer 201. For example, how a particular vector magnetometer 303 is connected to the laser carrier wafer 201 may introduce fluctuations that are particular to the vector magnetometer 303. By comparing the different fluctuations on connected magnetometers 303 along with the power measured from the laser carrier wafer 201, the processor 105 may normalize the operations of the lasers on the vector magnetometers 303.

Figure 4:
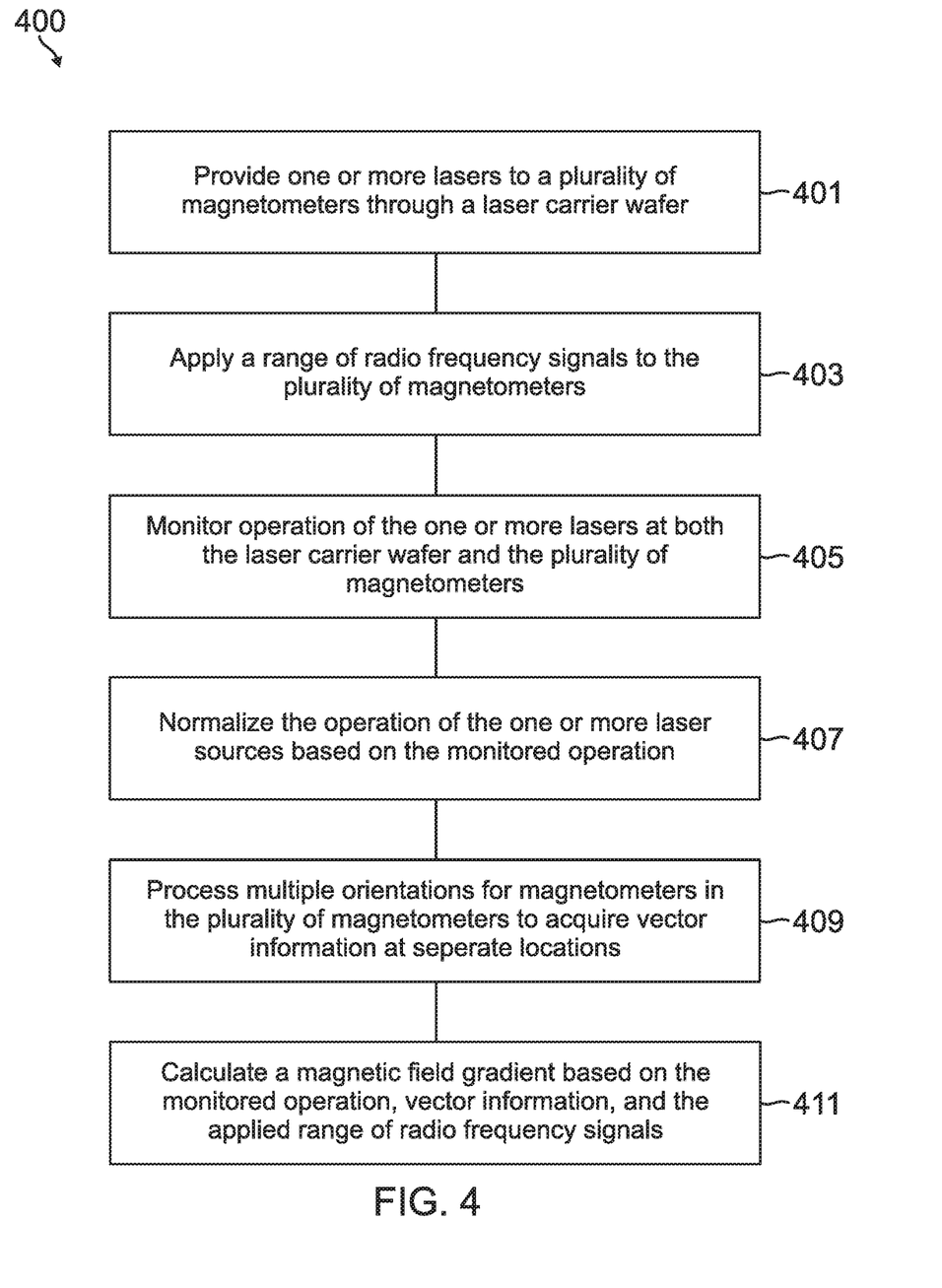
FIG. 4 is a flowchart diagram of a method for acquiring magnetic field gradient measurements using an integrated photonics tensor magnetometer according to an aspect of the present disclosure.

FIG. 4 is a flowchart diagram of a method 400 for providing a magnetic field gradient measurement using an integrated photonics tensor magnetometer according to embodiments described herein. Method 400 proceeds at 401, where one or more lasers are provided to a plurality of magnetometers through a laser carrier wafer. Additionally, the method 400 proceeds at 403, where a range of radio frequency signals are applied to the plurality of magnetometers. Further, the method 400 proceeds at 405, where the operation of the one or more lasers is monitored at both the laser carrier wafer and the plurality of magnetometers. Also, the method 400 proceeds at 407, where the operation of the one or more lasers is normalized based on the monitored operation. Further, the method 400 proceeds at 409, where multiple orientations for magnetometers in the plurality of magnetometers are processed to acquire vector information at separate locations. Moreover, the method 400 proceeds at 411, where a magnetic field gradient is calculated based on the monitored operation, vector information, and the applied range of radio frequency signals.

EXAMPLE EMBODIMENTS

Example 1 includes a system comprising: a plurality of magnetometers; a laser carrier wafer coupled to each of the plurality of magnetometers that commonly distributes one or more lasers to each of the magnetometers in the plurality of magnetometers; a plurality of photodetectors that detect light emitted from the laser carrier wafer and light emitted from the plurality of magnetometers; and one or more processors that execute computer-executable instructions that cause the one or more processors to monitor and control operation of the one or more lasers and calculate a magnetic field gradient based on the detected light from the plurality of magnetometers.

Example 2 includes the system of Example 1, further comprising a plurality of radio frequency sources that apply a range of radio frequency signals to each of the plurality of magnetometers.

Example 3 includes the system of any of Examples 1-2, wherein the one or more lasers are produced by: a pump laser source that produces a pump laser distributed to the plurality of magnetometers through a pump laser waveguide path; and a probe laser source that produces a probe laser distributed to the plurality of magnetometers through a probe laser waveguide path.

Example 4 includes the system of Example 3, wherein at least one of the pump laser source and the probe laser source is mounted on the laser carrier wafer.

Example 5 includes the system of any of Examples 3-4, wherein the laser carrier wafer comprises a pump laser integrated cavity associated with the pump laser waveguide path and a probe laser integrated cavity associated with the probe laser waveguide path, wherein the pump laser integrated cavity is used to maintain a wavelength of the pump laser at a resonant wavelength of the plurality of magnetometers and the probe laser integrated cavity is used to maintain a probe laser wavelength at a resonant wavelength of the plurality of magnetometers.

Example 6 includes the system of any of Examples 1-5, wherein the laser carrier wafer comprises a plurality of gratings for emitting portions of the one or more lasers from the laser carrier wafer for detection by the plurality of photodetectors.

Example 7 includes the system of any of Examples 1-6, wherein one or more photodetectors in the plurality of photodetectors detect the one or more lasers distributed to each of the magnetometers.

Example 8 includes the system of Example 7, wherein the one or more processors adjusts measurements provided by the plurality of magnetometers based on the detected one or more lasers distributed to the plurality of magnetometers.

Example 9 includes the system of Example 8, wherein a magnetometer in the plurality of magnetometers passes a portion of the one or more lasers directly through an absorption region to a photodetector in the plurality of photodetectors.

Example 10 includes a method comprising: providing one or more lasers from one or more laser sources to a plurality of magnetometers through a laser carrier wafer; applying a range of radio frequency signals to the plurality of magnetometers; monitoring operation of the one or more lasers provided to each of the plurality of magnetometers at both the laser carrier wafer and the plurality of magnetometers; normalizing the operation of the one or more laser sources based on the monitored operation; processing multiple orientations for magnetometers in the plurality of magnetometers to acquire vector information at separate locations; and calculating a magnetic field gradient based on the monitored operation, vector information, and the applied range of radio frequency signals for each of the plurality of magnetometers.

Example 11 includes the method of Example 10, wherein the range of radio frequency signals is associated with an expected range of magnetic fields experienced by the plurality of magnetometers.

Example 12 includes the method of any of Examples 10-11, wherein providing the one or more lasers comprises: distributing a pump laser to the plurality of magnetometers through a pump laser waveguide path; and distributing a probe laser to the plurality of magnetometers through a probe laser waveguide path.

Example 13 includes the method of Example 12, wherein at least one of the one or more laser sources that produces the pump laser and the probe laser is mounted on the laser carrier wafer.

Example 14 includes the method of any of Examples 10-13, further comprising: resonating at least one laser of the one or more lasers within an integrated cavity in the laser carrier wafer; detecting a resonant laser as an output from the integrated cavity; and controlling a frequency of the at least one laser based on the detected resonant laser.

Example 15 includes the method of any of Examples 10-14, wherein monitoring the operation of the one or more lasers at the laser carrier wafer comprises: emitting portions of the one or more lasers from one or more gratings; and detecting the emitted portions of the one or more lasers at one or more photodetectors.

Example 16 includes the method of any of Examples 10-15, wherein monitoring the operation of the one or more lasers at the plurality of magnetometers comprises routing a received laser in the one or more lasers directly through a bare waveguide to a photodetector.

Example 17 includes the method of Example 16, further comprising adjusting measurements provided by the plurality of magnetometers based on measurements of the one or more lasers distributed to the plurality of magnetometers by the photodetector.

Example 18 includes a system comprising: a plurality of magnetometers; a plurality of radio frequency sources that apply a range of radio frequency signals to each of the plurality of magnetometers; a laser carrier wafer coupled to each of the plurality of magnetometers that provides one or more lasers to each of the magnetometers in the plurality of magnetometers, wherein the laser carrier wafer comprises: one or more waveguide paths, wherein each waveguide path in the one or more waveguide paths commonly distributes a laser in the one or more lasers to each of the magnetometers; one or more integrated cavities, wherein each integrated cavity in the one or more integrated cavities is associated with a waveguide path in the one or more waveguide paths and locks the laser distributed within the waveguide path to a resonant frequency; and a plurality of gratings for emitting the one or more lasers from the one or more waveguide paths; a plurality of photodetectors that detect light emitted from the plurality of gratings from the laser carrier wafer and the plurality of magnetometers; and a processor that executes computer-executable instructions that cause the processor to: control operation of the one or more lasers based on electrical signals received from the plurality of photodetectors; calculate differences in the light provided to the plurality of magnetometers; and calculate a magnetic field gradient based on the detected light from and the applied range of radio frequency signals to the plurality of magnetometers.

Example 19 includes the system of Example 18, wherein the one or more lasers are produced by: a pump laser source that produces a pump laser distributed to the plurality of magnetometers through a pump laser waveguide path; and a probe laser source that produces a probe laser distributed to the plurality of magnetometers through a probe laser waveguide path.

Example 20 includes the system of any of Examples 18-19, wherein a magnetometer in the plurality of magnetometers passes a portion of a received laser in the one or more lasers directly through to a photodetector in the plurality of photodetectors for detection.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof

What is claimed is:

1. A system comprising:
   a plurality of magnetometers;
   a plurality of radio frequency sources that apply a range of radio frequency signals to each of the plurality of magnetometers;
   a laser carrier wafer coupled to each of the plurality of magnetometers that provides one or more lasers to each of the magnetometers in the plurality of magnetometers, wherein the laser carrier wafer comprises:
     one or more waveguide paths, wherein each waveguide path in the one or more waveguide paths commonly distributes a laser in the one or more lasers to each of the magnetometers;
     one or more integrated cavities, wherein each integrated cavity in the one or more integrated cavities is associated with a waveguide path in the one or more waveguide paths and locks the laser distributed within the waveguide path to a resonant frequency; and
     a plurality of gratings for emitting the one or more lasers from the one or more waveguide paths;
   a plurality of photodetectors that detect light emitted from the plurality of gratings from the laser carrier wafer and the plurality of magnetometers; and
   a processor that executes computer-executable instructions that cause the processor to:
     control operation of the one or more lasers based on electrical signals received from the plurality of photodetectors;
     calculate differences in the light provided to the plurality of magnetometers; and
     calculate a magnetic field gradient based on the detected light from and the applied range of radio frequency signals to the plurality of magnetometers.

2. The system of claim 1, wherein the one or more lasers are produced by:
   a pump laser source that produces a pump laser distributed to the plurality of magnetometers through a pump laser waveguide path; and
   a probe laser source that produces a probe laser distributed to the plurality of magnetometers through a probe laser waveguide path.

3. The system of claim 1, wherein a magnetometer in the plurality of magnetometers passes a portion of a received laser in the one or more lasers directly through to a photodetector in the plurality of photodetectors for detection.

4. A system comprising:
   a plurality of magnetometers;
   a laser carrier wafer coupled to each of the plurality of magnetometers that commonly distributes one or more lasers to each of the magnetometers in the plurality of magnetometers;
   a plurality of photodetectors that detect light emitted from the laser carrier wafer and light emitted from the plurality of magnetometers; and
   one or more processors that execute computer-executable instructions that cause the one or more processors to monitor and control operation of the one or more lasers and calculate a magnetic field gradient based on the detected light from the plurality of magnetometers.

5. The system of claim 4, further comprising a plurality of radio frequency sources that apply a range of radio frequency signals to each of the plurality of magnetometers.

6. The system of claim 4, wherein the one or more lasers are produced by:
   a pump laser source that produces a pump laser distributed to the plurality of magnetometers through a pump laser waveguide path; and
   a probe laser source that produces a probe laser distributed to the plurality of magnetometers through a probe laser waveguide path.

7. The system of claim 6, wherein at least one of the pump laser source and the probe laser source is mounted on the laser carrier wafer.

8. The system of claim 6, wherein the laser carrier wafer comprises a pump laser integrated cavity associated with the pump laser waveguide path and a probe laser integrated cavity associated with the probe laser waveguide path, wherein the pump laser integrated cavity is used to maintain a wavelength of the pump laser at a resonant wavelength of the plurality of magnetometers and the probe laser integrated cavity is used to maintain a probe laser wavelength at a resonant wavelength of the plurality of magnetometers.

9. The system of claim 4, wherein the laser carrier wafer comprises a plurality of gratings for emitting portions of the one or more lasers from the laser carrier wafer for detection by the plurality of photodetectors.

10. The system of claim 4, wherein one or more photodetectors in the plurality of photodetectors detect the one or more lasers distributed to each of the magnetometers.

11. The system of claim 10, wherein the one or more processors adjusts measurements provided by the plurality of magnetometers based on the detected one or more lasers distributed to the plurality of magnetometers.

12. The system of claim 11, wherein a magnetometer in the plurality of magnetometers passes a portion of the one or more lasers directly through an absorption region to a photodetector in the plurality of photodetectors.

13. A method comprising:
   providing one or more lasers from one or more laser sources to a plurality of magnetometers through a laser carrier wafer;
   applying a range of radio frequency signals to the plurality of magnetometers;

monitoring operation of the one or more lasers provided to each of the plurality of magnetometers at both the laser carrier wafer and the plurality of magnetometers;

normalizing the operation of the one or more laser sources based on the monitored operation;

processing multiple orientations for magnetometers in the plurality of magnetometers to acquire vector information at separate locations; and calculating a magnetic field gradient based on the monitored operation, vector information, and the applied range of radio frequency signals for each of the plurality of magnetometers.

14. The method of claim 13, wherein the range of radio frequency signals is associated with an expected range of magnetic fields experienced by the plurality of magnetometers.

15. The method of claim 13, wherein providing the one or more lasers comprises:

distributing a pump laser to the plurality of magnetometers through a pump laser waveguide path; and distributing a probe laser to the plurality of magnetometers through a probe laser waveguide path.

16. The method of claim 15, wherein at least one of the one or more laser sources that produces the pump laser and the probe laser is mounted on the laser carrier wafer.

17. The method of claim 13, further comprising:

resonating at least one laser of the one or more lasers within an integrated cavity in the laser carrier wafer;

detecting a resonant laser as an output from the integrated cavity; and controlling a frequency of the at least one laser based on the detected resonant laser.

18. The method of claim 13, wherein monitoring the operation of the one or more lasers at the laser carrier wafer comprises:

emitting portions of the one or more lasers from one or more gratings; and detecting the emitted portions of the one or more lasers at one or more photodetectors.

19. The method of claim 13, wherein monitoring the operation of the one or more lasers at the plurality of magnetometers comprises routing a received laser in the one or more lasers directly through a bare waveguide to a photodetector.

20. The method of claim 19, further comprising adjusting measurements provided by the plurality of magnetometers based on measurements of the one or more lasers distributed to the plurality of magnetometers by the photodetector.

* * * * *